United States Patent
Thomas

(10) Patent No.: US 6,798,680 B2
(45) Date of Patent: Sep. 28, 2004

(54) READ-ONLY MOS MEMORY

(75) Inventor: Sigrid Thomas, Grenoble (FR)

(73) Assignee: STMicroelectronics S.A., Montrouge (FR)

( * ) Notice: Subject to any disclaimer, the term of this patent is extended or adjusted under 35 U.S.C. 154(b) by 1 day.

(21) Appl. No.: 10/172,179

(22) Filed: Jun. 14, 2002

(65) Prior Publication Data

US 2002/0191432 A1 Dec. 19, 2002

(30) Foreign Application Priority Data

Jun. 15, 2001 (FR) .............................. 01 07872

(51) Int. Cl.⁷ .............................................. G11C 5/06
(52) U.S. Cl. .................... 365/63; 365/185.05
(58) Field of Search ............... 365/63, 185.05

(56) References Cited

U.S. PATENT DOCUMENTS 3,914,855 A   10/1974   Cheney et al. ................. 29/571
5,010,519 A * 4/1991   Yoshimoto et al. ......... 365/149
5,291,453 A * 3/1994   Aota et al. .................... 365/221
5,471,420 A * 11/1995  Nii et al. ...................... 365/182

FOREIGN PATENT DOCUMENTS

DE      25 43 138       4/1976
EP      0 890 985 A1    1/1999

* cited by examiner

Primary Examiner—Anh Phung
Assistant Examiner—Tuan T. Nguyen
(74) Attorney, Agent, or Firm—Lisa K. Jorgenson; Robert Iannucci; Seed IP Law Group PLLC

(57) ABSTRACT

A read-only memory formed of cells, each of which includes, between a selection line and a bit line, the series connection of a memory element and of a selection MOS transistor with a gate connected to a read control line. The memory elements of blank cells are P-channel MOS transistors and the memory elements of programmed cells are uniformly N-type doped semiconductor regions.

14 Claims, 3 Drawing Sheets

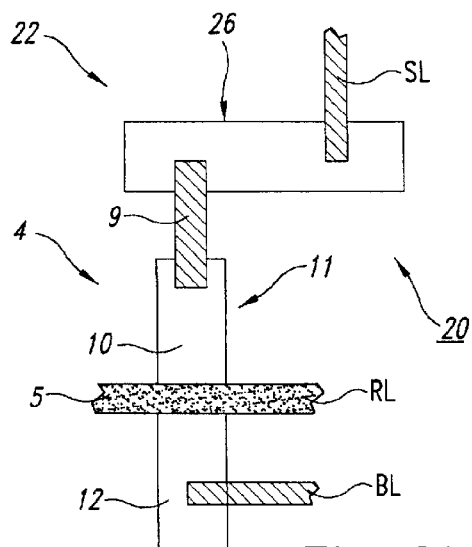
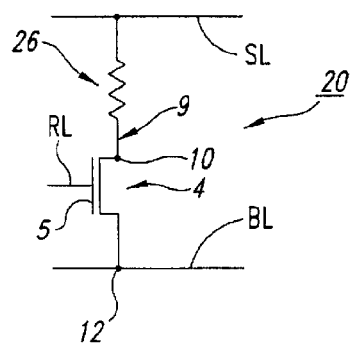
Fig. 2A     Fig. 2B
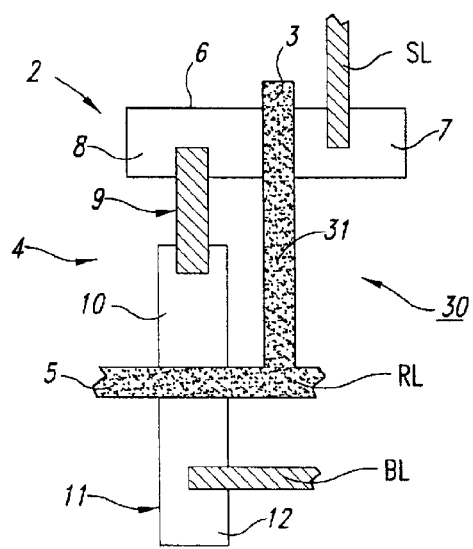
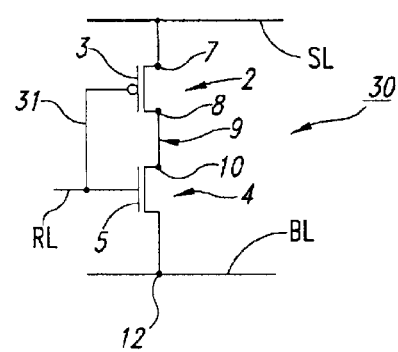
Fig. 3A     Fig. 3B

READ-ONLY MOS MEMORY

BACKGROUND OF THE INVENTION

1. Field of the Invention

The present invention relates to the forming in integrated form of memories. More specifically, the present invention relates to the integration of read-only memories (ROMs).

2. Description of the Related Art

Such memories are intended for the storing of data or functions intended to be always available and not reprogrammable.

Upon design of an integrated circuit including such a ROM, at least one prototype memory circuit, especially intended to test whether the data provided to be stored in the memory enable fulfilling desired functions, is formed.

To reduce the number of formed prototypes, it has been provided to form the prototype memory in the form of a programmable array. It is thus possible to modify the number and the arrangement of programmed or unprogrammed cells of the memory array in successive checking operations.

To form the programmable prototype memory, electrically-programmable cells erasable by being exposed to ultraviolet rays may be used.

FIG. 1A illustrates the equivalent electric diagram of an embodiment of such a cell 1. Cell 1 includes, between a selection line SL and a bit line BL, the series connection of a memory element and of a selection element. The memory element is a P-channel MOS transistor 2, gate 3 of which is unconnected. The selection element is a MOS transistor 4. As a non-limiting example, it will be considered in the following description that selection transistor 4 is an N-channel transistor. However, it could also be a P-channel transistor. Gate 5 of transistor 4 is connected to a read line RL.

FIG. 1B illustrates an embodiment in integrated form of the cell of FIG. 1A.

Memory transistor 2 is formed in a first active area 6 of a silicon substrate. A channel area of transistor 2, defined by unconnected isolated gate 3, separates, in active area 6, source 7 and drain 8 of transistor 2. Selection line SL is in contact with source 7. Drain 8 is integral with one end of a conductive connection 9. The other end of conductive connection 9 is in contact with source 10 of selection transistor 4. Selection transistor 4 is formed in a second active area 11 of the same substrate as first active area 6. Source 10 of transistor 4 is separated from drain 12 by a channel area defined by isolated gate 5, formed on area 11. Drain 12 of selection transistor 4 is in contact with bit line BL.

In the forming of a complete array, selection and read lines SL and RL are common to the cells of a same row, while bit line BL is common to the cells of a same column.

The operation of a programmable array formed of cells identical to cell 1 of FIG. 1 is the following. When a datum is desired to be programmed in a cell, this cell is selected via appropriate signals on read line RL to turn selection transistor 4 on. In the considered case of an N-channel selection transistor 4, read line RL, that is, gate 5 of transistor 4, is brought to a high biasing level VDD. Line BL is grounded. Selection line SL (source 7 of transistor 2) is brought to a programming level VPP raised with respect to high level VDD. The insulator of gate 3 of memory transistor 2 is chosen to enable in these conditions the passing of electrons on gate 3 (programming by hot electrons).

The reading of a datum stored in a programmable cell 1 is performed as follows. Selection line SL is brought to high level VDD. Gate 5 of transistor 1 is biased to level VDD to turn on selection transistor 4. Then, if memory transistor 2 has been previously programmed, it is at least partially conductive due to the charges accumulated on its unconnected gate 3. The voltage level copied by selection transistor 4 on bit line BL then is relatively close to high level VDD. However, if memory transistor 2 has undergone no programming, it is totally non-conductive (off) and line BL is brought to a relatively low level with respect to high level VDD.

To determine the data to be contained in the programmable array, the following step succession is repeated:

programming such a memory array;

testing the circuit operation; and erasing with ultraviolet rays the array data.

These steps are repeated until the functional test is satisfactory. Once the number of programmed and unprogrammed (blank) cells and their configuration specific to the desired operation have been determined, a definitive integrated circuit including a read-only memory is manufactured.

Thus, the conventional industrial process of manufacturing of an integrated circuit containing immovably stored data includes the steps of manufacturing a prototype circuit containing a programmable memory, then a definitive circuit containing a definitive ROM, the definitive ROM containing for example a simple transistor at the level of each memory point and being clearly distinct from the programmable memory. This requires, for each circuit, manufacturing two sets of masks very different from each other.

BRIEF SUMMARY OF THE INVENTION

An embodiment of the present invention provides for a method and device for simplifying this manufacturing process.

The applicant has noticed that the general manufacturing cost of prior art designs (prototype memory plus definitive memory) may be higher than the gain resulting from the inserting of an optimized ROM in the definitive circuit.

Thus, an embodiment of the present invention provides a read-only memory which is slightly different from a programmable memory.

Another embodiment of the present invention provides a ROM which can be easily formed in a memory array also including a programmable sector.

Another embodiment of the present invention provides a method for converting a programmable memory into a ROM which is compatible with the above embodiments.

An embodiment of the present invention provides a read-only memory formed of cells, each of which includes, between a selection line and a bit line, the series connection of a memory element and of a selection MOS transistor with a gate connected to a read control line. The memory elements of blank cells are P-channel MOS transistors and the memory elements of programmed cells are uniformly N-type doped semiconductor regions.

According to an embodiment of the present invention, the gates of the memory transistors of the blank cells are unconnected.

According to an embodiment of the present invention, the selection transistor of at least one blank cell is an N-channel transistor and the gates of the memory and selection transistors of said at least one blank cell are interconnected by a conductive connection.

According to an embodiment of the present invention, the read-only memory is formed in the same integrated circuit chip as a programmable memory formed of cells including, between a selection line and a bit line, the series connection of a P-channel MOS transistor, the gate of which is unconnected, and of a MOS transistor, the gate of which is connected to a read control line, the lines of selection of the read-only and programmable memories being connectable to a selection power supply and the lines of selection of the sole programmable memory being selectively connectable to a write power supply distinct from said selection power supply.

An embodiment of the present invention also provides a method for forming, in a single-crystal semiconductor substrate, a read-only memory, including the steps of defining first and second active areas of same dimension; forming isolated lines above the second areas and some of the first areas; implanting the exposed portions of said first and second active areas; depositing an insulator over the entire structure; opening said insulator to partially expose each of the first and second areas, in the vicinity of each of its ends; and forming selection lines in contact with the first active areas, conductive connections to match each first active area with a second active area, and bit lines in contact with said second active areas.

The foregoing embodiments of the present invention will be discussed in detail in the following non-limiting description of specific embodiments in connection with the accompanying drawings.

BRIEF DESCRIPTION OF THE SEVERAL VIEWS OF THE DRAWING(S)

FIGS. 2A and 2B schematically illustrate a programmed cell of a read-only memory array according to an embodiment of the present invention; and FIGS. 3A and 3B schematically illustrate a blank (unprogrammed) cell of a read-only memory array according to an embodiment of the present invention.

Figure 4A:
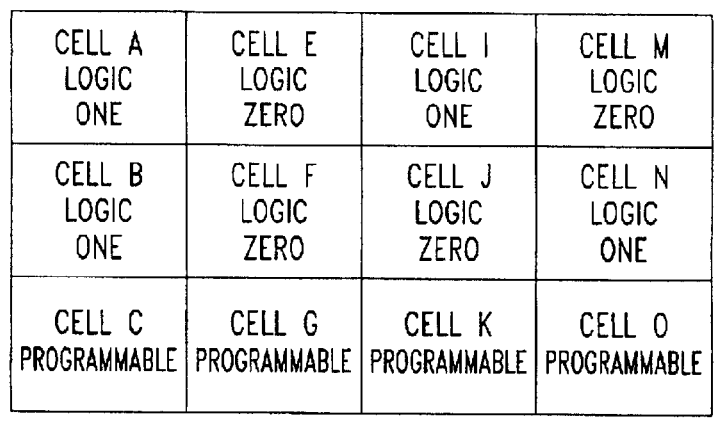

FIG. 4A illustrates a memory array of having read-only logic-one cells, read-only logic-zero cells and programmable cells.

Figure 4B:
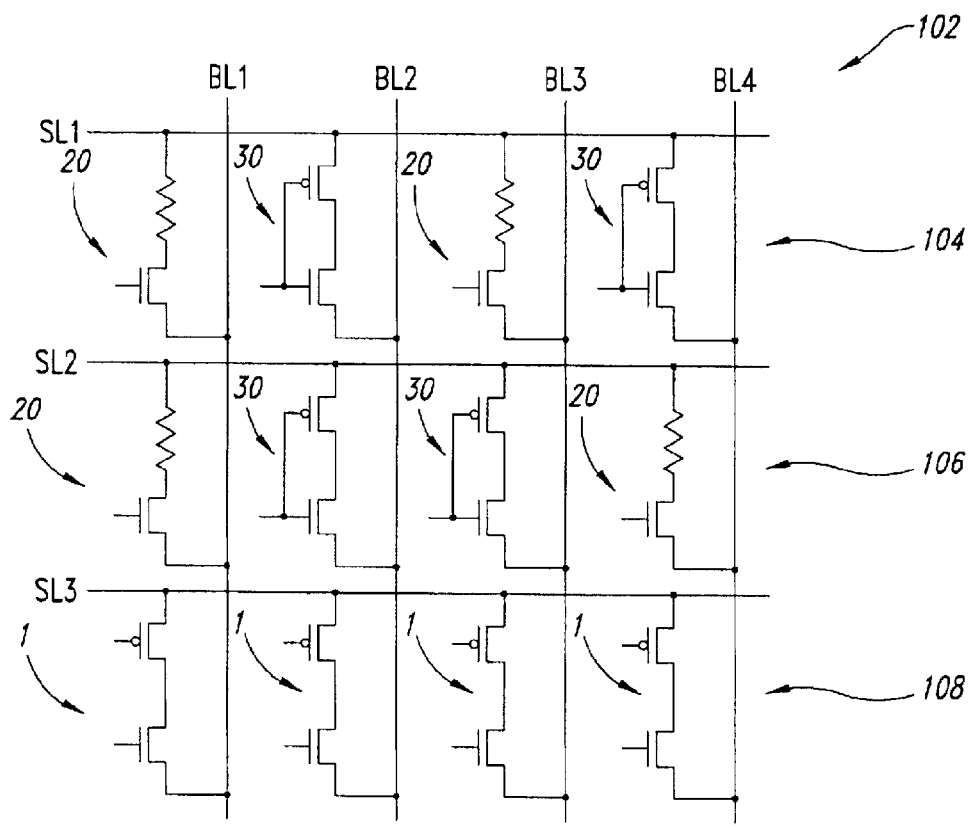

FIG. 4B is a schematic diagram of the memory array of FIG. 4A.

DETAILED DESCRIPTION OF THE INVENTION

For clarity, same elements have been designated with the same references in the different drawings. Further, as usual in the representation of integrated circuits, the top views of FIGS. 1B, 2A, and 3A are not shown to scale.

Figure 1A:
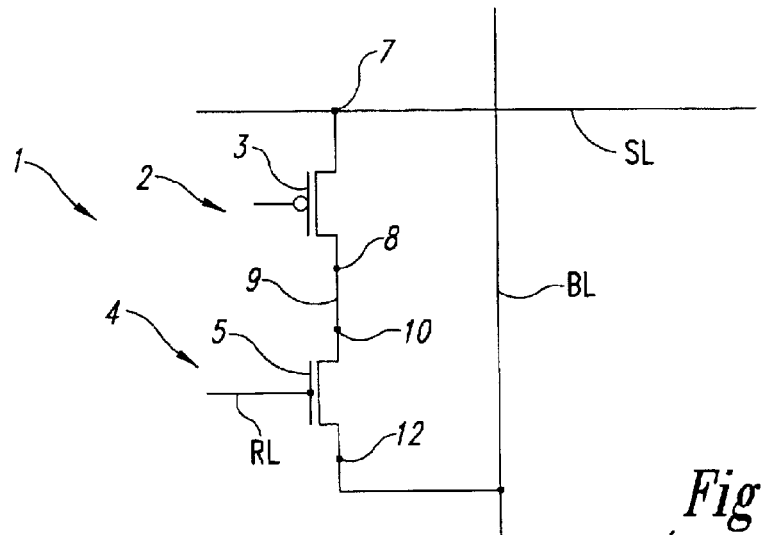
FIG. 1A is an electric diagram of an elementary cell of a conventional programmable array.
Figure 1B:
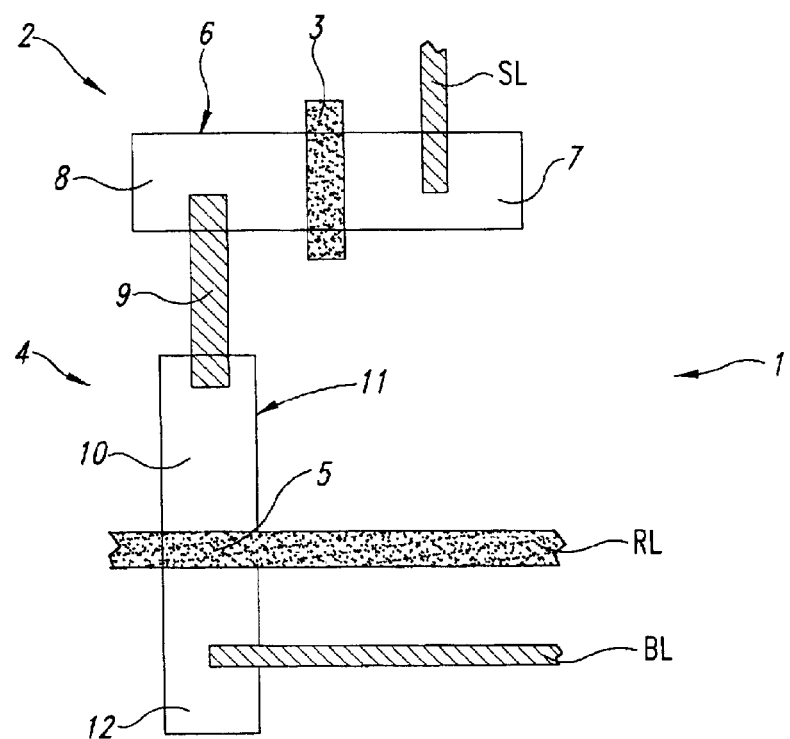
FIG. 1B is a partial simplified top view of an example of implementation in integrated form of the cell of FIG. 1A.

An embodiment of the present invention uses as elementary cells of a ROM, according to their programmed or unprogrammed (blank) state, cells identical or similar to a programmable cell such as cell 1 of FIG. 1B.

FIG. 2A schematically illustrates in a partial top view the monolithic forming of a programmed cell 20 according to an embodiment of the present invention. FIG. 2B is an equivalent electric diagram of cell 20 of FIG. 2A.

A programmed cell 20 includes a selection element identical to that of a previously-described programmable cell (1, FIG. 1). It is, for example, a MOS transistor 4, preferably with an N channel, formed in an active area 11 of a semiconductor substrate. Programmed cell 20 also includes a memory element 22 similar to memory element 2 of programmable cell 1 of FIG. 1B. However, the gate of the transistor forming programmable memory element 2 is suppressed. Thus, memory element 22 is no longer formed of a MOS transistor, but of a uniformly-doped active area 26, which behaves as a resistor.

As illustrated in FIG. 2B, programmed cell 20 includes, between selection line SL and bit line BL, the series connection of the resistor formed by memory area 26 and of selection transistor 4.

In a read operation, selection line SL is biased to a high level VDD. Gate 5 of selection transistor 4 is biased by read line RL to a read level turning on selection transistor 4. In the case of an N-channel selection transistor 4, the read level is equal to high level VDD. Then, memory area 26 behaves as a resistor. Selection transistor 4 thus copies on bit line BL a level close to high voltage level VDD of selection line SL.

According to an embodiment of the present invention, a blank (unprogrammed) cell of a ROM is identical to a programmable cell 1 of FIG. 1B in which no data have been memorized. Memory transistor 2 still is non-conductive. In a read access, selection transistor 4 thus copies on bit line BL a relatively low level with respect to high level VDD.

The use according to the present invention of a read-only memory having programmed and blank cells such as previously described is particularly advantageous. In particular, its obtaining based on the prototype programmable array is easy. Indeed, it is sufficient to modify the sole mask of definition of the transistor gates to suppress those of the memory elements of programmed cells. In many cases, the manufacturing cost reduction resulting from the use of a set of masks similar to that used to form the programmable prototype compensates for the increase in integration surface area with respect to an optimized ROM.

FIG. 3A illustrates, in a simplified partial top view, another embodiment of a blank cell 30 according to the present invention. FIG. 3B illustrates the equivalent electric diagram of cell 30 of FIG. 3A.

The selection element is an N-channel MOS transistor 4 (it can no longer be a P-channel MOS transistor). Gate 3 of memory transistor 2 is connected, by a conductive connection 31, to gate 5 of selection transistor 4.

The presence of connection 31 advantageously enables avoiding self-programming of memory transistor 2. Indeed, if in a read access, electrons pass over gate 3, due to high level VDD of selection line SL, they are derived by read line RL which, to turn on complementary selection transistor 4, also is at high level VDD. Memory transistor 2 then always remains off (non-conductive).

As indicated previously, the programmed (20, FIG. 2) and blank cells of a read-only memory according to the present invention are formed by a method similar to the forming of a programmable array:

active 6, 11, 26 areas are defined in a silicon substrate;

isolated gates 3, 5 are formed above all active areas except for those (26) intended to form the memory elements of programmed cells 20;

appropriate dopants are implanted in each of the active areas; and contacts between the appropriate semiconductor regions and connections or conductive lines 9, SL, RL, and BL are formed.

In the case of blank read-only cells of the type of cell 30 of FIG. 3, connections 31 of interconnection of gates 3 and 5 of memory and selection transistors 2 and 4 are formed, preferably, at the same time as gates 3 and 5. Thus, again, only the gate definition mask is modified with respect to the set of masks used to manufacture the programmable prototype array.

A read-only memory according to the present invention can thus be simply formed, simultaneously to a programmable memory such as described in relation with FIG. 1.

Shown in FIGS. 4A and 4B is a general memory array 100 that includes a first ROM Sector 104 of programmed and blank memory cells, a second ROM Sector 106 of programmed and blank memory cells, and a programmable memory Sector 108 of 100 programmable memory cells. Each sector 104 & 108 may contain multiple rows of memory cells. Preferably, the sectors 2-4-108 of the general memory array of FIGS. 4A and 4B will share the same bit lines. However, the selection lines are assigned by sector according to the programmable or read-only nature of the considered sector. Thus, in the ROM sectors 104, 106 as shown in FIG. 4B, the selection lines are adapted to being biased at most to high level VDD. However, in the programmable memory sector 108 of FIG. 4B, the selection lines are adapted to being biased either to a level VDD, or to a programming level VPP raised with respect to high level VDD.

The advantages of the forming of a memory array including programmable sectors and read-only sectors are many.

Thus, in the previously-described design steps, it is possible to store in the read-only sector information, for example, concerning the designer, the circuit finality, or an access code for the array, to forbid, if necessary, its access to an unauthorized user.

It is also possible, in the test steps, to have a read-only sector memorizing the data or the functions to be processed and a programmable sector in which the function to be implemented is carried out. In the successive test and modification steps, only the programmable sector is erasable and accessible to the designer. This reduces the circuit testing time by the time conventionally necessary to reprogram the certain data or functions now contained in the read-only memory.

The conversion of a programmable sector into a read-only sector is relatively simple and can be performed between two prototypes. Thus, based on a programmable array, a first test series can show a correct operation of one portion of the array. Then, this portion is turned into a read-only portion, to which access is forbidden to the tester, on the one hand, by making impossible the biasing of its selection lines to a programming level VPP and, on the other hand, by reducing a UV lighting window provided to face the sole programmable portion.

A single read circuit common to the programmable array and to the read-only array may be provided, which substantially divides by two the surface area occupied by the read circuit with respect to the case where the programmable and read-only arrays are memory blocks of distinct natures.

Finally, maintaining a programmable array enables a possible user to input new data or modify a function.

The present invention is likely to have various alterations, modifications, and improvements which will readily occur to those skilled in the art. In particular, the present invention has been previously described as a non-limiting example in relation with FIGS. 2 and 3 in the case of the association of a memory element and of an N-channel type selection transistor. However, the present invention also applies to the case of a P-channel selection transistor. In this last case, however, the gates of the selection and memory transistors of the blank cells of the read-only memory will not be interconnected. The gates of the memory transistors of the blank cells will be unconnected while the gates of the associated selection transistors will be connected to a respective read line RL.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A read-only memory comprising programmed and blank cells, each of the cells including, between a selection line and a bit line, a series connection of a memory element and of a MOS selection transistor with a gate connected to a read control line, wherein the memory elements of the blank cells are P-channel MOS transistors; and wherein the memory elements of the programmed cells are uniformly N-type doped semiconductor regions.

2. The memory of claim 1, wherein the memory elements of the blank cells have gates that are unconnected.

3. The memory of claim 1, wherein the selection transistor of at least one of the blank cells is an N-channel transistor and wherein the gates of the memory element and selection transistor of said at least one blank cell are interconnected by a conductive connection.

4. The memory of claim 1, wherein the selection line is one of a plurality of selection line, the bit line is one of the plurality of bit lines, and the read control line is one of a plurality of read control lines and the read-only memory is formed in a same integrated circuit chip as a programmable memory formed of cells including, between a respective one of the selection lines and a respective one of the plurality of bit lines, a series connection of a P-channel MOS transistor, having a gate, unconnected, and of a MOS transistor, having a gate connected to a respective one of the read control lines, the selection lines of the read-only and programmable memories being connectable to a selection power supply and the selection lines of the programmable memory being selectively connectable to a write power supply distinct from said selection power supply.

5. A memory integrated in a semiconductor substrate, the memory comprising:
   a blank cell including, between a first selection line and a first bit line, a series connection of a memory element and of a selection transistor with a gate connected to a first read control line, wherein the memory element of the blank cells is a memory transistor with a channel of a first conductivity type; and
   a programmed cell including, between a second selection line and a second bit line, a series connection of a memory element and of a selection transistor with a gate connected to a second read control line, the memory element of the programmed cell includes a doped semiconductor region of a second conductivity type.

6. The memory of claim 5, wherein the memory element of the blank cell has a gate that is unconnected.

7. The memory of claim 5, wherein the selection transistor of the blank cell is transistor with a channel of the second conductivity type and the memory transistor of the blank cell has a gate, wherein the gates of the memory and selection transistors of the blank cell are interconnected by a conductive connection.

8. The memory of claim 5 wherein the first selection line and the first read control line extend along a row of memory cells of the memory, the first bit line extends along a column of memory cells of the memory, the gate of the selection transistor of the blank cell is formed of the first read control line, and the memory transistor of the blank cell has a gate that is connected, and extends substantially orthogonal, to the gate of the selection transistor of the blank cell.

9. The memory of claim 5, further comprising programmable memory cells including, between a third selection line and a third bit line, a series connection of a P-channel MOS transistor, having a gate, unconnected, and of an N-channel MOS transistor, having a gate connected to a third read control line, the selection lines of the programmed, blank, and programmable cells being connectable to a selection power supply and the selection lines of the programmable memory cells being selectively connectable to a write power supply distinct from said selection power supply.

10. The memory of claim 5 wherein the semiconductor regions of the memory elements of the programmed cells are doped regions of the semiconductor substrate.

11. A memory integrated in a semiconductor substrate, the memory comprising:

a first memory cell including, between a first selection line and a first bit line, a series connection of first and second MOS transistors having respective gates that are coupled to each other, the first MOS transistor having a channel of a first conductivity type and the second MOS transistor having a channel of a second conductivity type.

12. The memory of claim 11, further comprising:

a second memory cell including, between a second selection line and a second bit line, a series connection of a memory element and of a MOS selection transistor with a gate connected to a read control line; and wherein the memory element includes a resistance formed of a doped semiconductor region of the second conductivity type.

13. The memory of claim 11 wherein the first selection line and the first read control line extend along a row of memory cells of the memory, the first bit line extends along a column of memory cells of the memory, the gate of the first MOS transistor is formed of the first read control line, and the gate of the second MOS transistor is connected, and extends substantially orthogonal, to the gate of the first MOS transistor.

14. The memory of claim 11, further comprising a programmable second memory cell including, between a second selection line and a second bit line, a series connection of a P-channel MOS transistor, having an unconnected gate, and of an N-channel MOS transistor, having a gate connected to a second read control line, the selection lines of the first and second memory cells being connectable to a selection power supply and the selection lines of the second memory cell being selectively connectable to a write power supply distinct from said selection power supply.

* * * * *